United States Patent
Chayat et al.

(10) Patent No.: US 11,171,623 B2
(45) Date of Patent: Nov. 9, 2021

(54) TRANSMISSION-LINE-BASED SIGNAL DISTRIBUTION AND AGGREGATION

(71) Applicant: VAYYAR IMAGING LTD., Yehud (IL)

(72) Inventors: Naftali Chayat, Kfar Saba (IL); Nadav Mazor, Givatayim (IL)

(73) Assignee: VAYYAR IMAGING LTD., Yehud (IL)

( * ) Notice: Subject to any disclaimer, the term of this patent is extended or adjusted under 35 U.S.C. 154(b) by 36 days.

(21) Appl. No.: 16/655,314

(22) Filed: Oct. 17, 2019

(65) Prior Publication Data

US 2020/0127631 A1    Apr. 23, 2020

Related U.S. Application Data

(60) Provisional application No. 62/746,594, filed on Oct. 17, 2018.

(51) Int. Cl.
*H03H 7/46* (2006.01)
*H03H 7/00* (2006.01)

(52) U.S. Cl.
CPC ............ *H03H 7/468* (2013.01); *H03H 7/004* (2013.01)

(58) Field of Classification Search
CPC ............ H03F 3/602; H03F 3/60; H03F 3/605; H03H 7/004; H03H 7/468
See application file for complete search history.

(56) References Cited

U.S. PATENT DOCUMENTS

| | | | |
|---|---|---|---|
| 2,018,320 A | 10/1935 | Roberts | |
| 2,424,238 A | 7/1947 | Johnson | |
| 4,199,668 A | 4/1980 | Scozzari | |
| 5,093,723 A | 3/1992 | Yang | |
| 5,550,513 A * | 8/1996 | Wong ...................... | H03F 3/605 330/286 |
| 6,094,099 A * | 7/2000 | Kobayashi ........... | H03G 1/0023 330/254 |
| 7,146,103 B2 * | 12/2006 | Yee ..................... | H04B 10/2507 398/68 |
| 8,704,592 B2 * | 4/2014 | Tatsumi .............. | H03F 3/45089 330/53 |
| 9,641,136 B2 * | 5/2017 | Tatsumi .................. | H03F 1/486 |

(Continued)

OTHER PUBLICATIONS

International Search Report for PCT Application No. PCT/IB2019/051460 dated Feb. 20, 2020.

*Primary Examiner* — Dean O Takaoka
(74) *Attorney, Agent, or Firm* — Mark Cohen; Pearl Cohen Zedek Latzer Baratz

(57) ABSTRACT

A tapped transmission line for distributing an electrical signal, such as an RF signal, to multiple modules, and/or aggregating signals from multiple modules. Embodiments of the invention provide a tapped transmission line based on a transmission-line medium along which tap elements are dispersed, so that the tap elements have a predominantly capacitive loading of the transmission-line medium. Methods for compensating the loss of the transmission-line medium are presented as well. Applications for distribution of transmitted signals, of local oscillator signals, and to aggregation of signals from multiple oscillators are disclosed. The invention is particularly applicable to integrated circuits (IC, ASIC, RFIC), and to multichannel RF systems such as phased array and MIMO systems.

19 Claims, 12 Drawing Sheets

(56) References Cited

U.S. PATENT DOCUMENTS

| | | | |
|---|---|---|---|
| 2006/0055464 A1* | 3/2006 | Leyten | H03F 3/605 330/286 |
| 2009/0102574 A1* | 4/2009 | Vickes | H03F 3/602 333/25 |
| 2009/0148094 A1* | 6/2009 | Kucharski | G02F 1/025 385/2 |
| 2010/0301671 A1 | 12/2010 | Asmanis et al. | |
| 2017/0099038 A1* | 4/2017 | Kobayashi | H03F 3/604 |

* cited by examiner

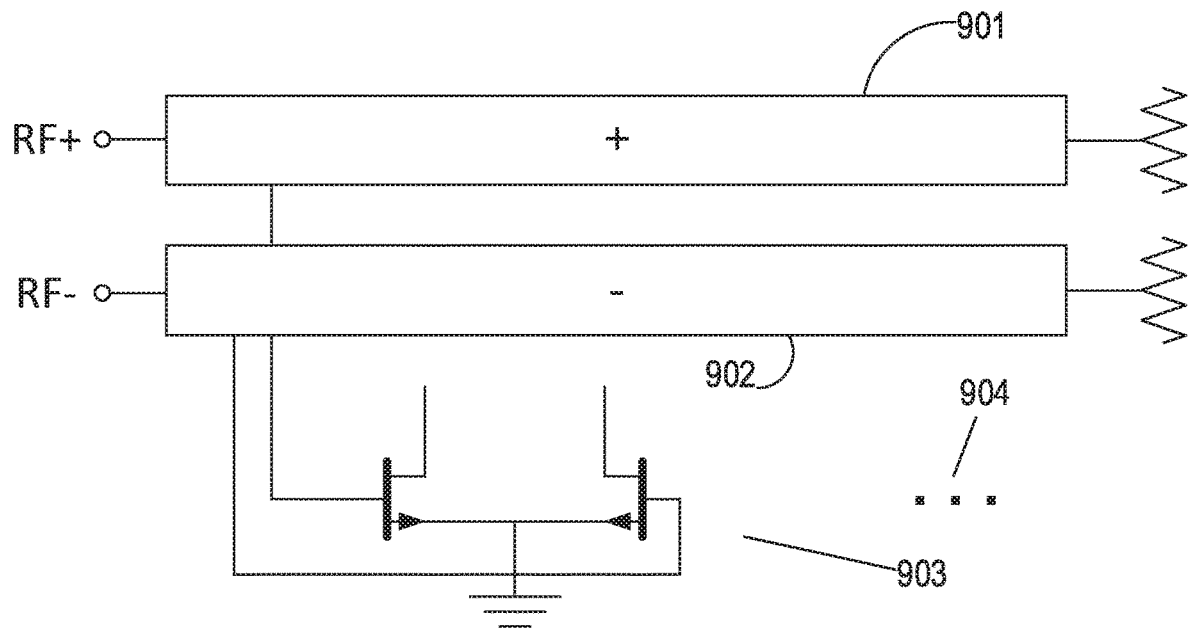
Fig. 9a
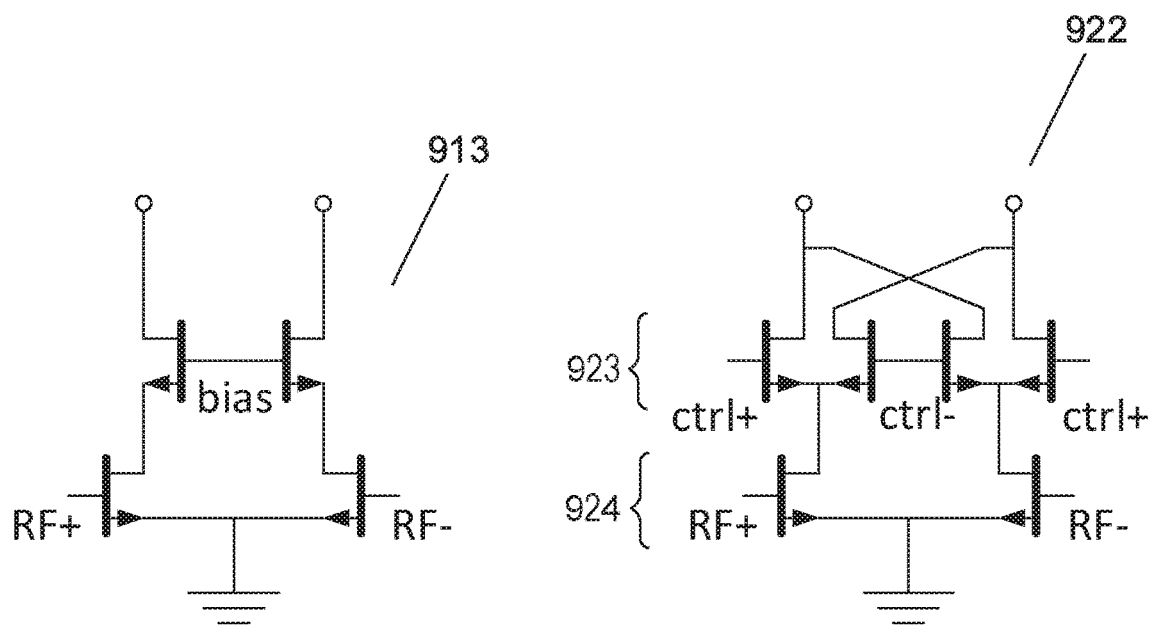
Fig. 9b
Fig. 9c

TRANSMISSION-LINE-BASED SIGNAL DISTRIBUTION AND AGGREGATION

CROSS REFERENCE TO RELATED APPLICATION

This application claims benefit of U.S. Provisional Patent Application Ser. No. 62/746,594, filed Oct. 17, 2018, entitled "Transmission-line-based signal distribution and aggregation", the disclosure of which is hereby incorporated by reference and the priority of which is hereby claimed pursuant to 37 CFR 1.78(a) (4) and (5)(i).

FIELD

The present invention relates to radio-frequency circuits comprising multiple units to which signals need to be distributed and/or from which signals need to be aggregated.

BACKGROUND

A non-limiting example of a need for such signal distribution and aggregation is an active antenna array, in which tens or more of transceivers need to be attached to a signal source, signal sink, or a down-converting local oscillator. A common solution for this need is to use power splitters/combiners, typically with amplifiers to compensate for the splitter/combiner loss. Another solution, encountered for example in cable TV systems, is to use directional couplers along a transmission-line medium, each tapping a small fraction of the signal in the line, while maintaining the broadband matching of the line. Electromagnetic directional couplers usually consume space on the order of ¼-wavelength or more at the lowest frequency of operation, or require ferrite transformers. Unfortunately, none of the current solutions is suitable for incorporation into integrated circuits. It would therefore be advantageous to have a solution to the signal distribution/aggregation problem that overcomes the restrictions of the current approaches. This goal is attained by embodiments of the present invention.

SUMMARY

Certain embodiments of the present invention, as disclosed herein provide signal distribution via a transmission-line medium along which substantially identical tap element amplifiers are placed at substantially identical intervals of physical position along the transmission-line medium, each amplifier having a predominantly capacitive input impedance. The short transmission-line medium sections between tap elements, combined with the tap element amplifier input capacitance, form an artificial transmission-line medium of reduced characteristic impedance. Such an artificial transmission line has a cut-off frequency, which is designed to be above the desired signal frequency range. The concept is illustrated in a non-limiting design of distribution network in a radio-frequency integrated circuit (RFIC), where tap element amplifiers are spaced 200 microns from one another; the signal is distributed to 12 amplifiers, and the frequency range exceeds 80 GHz. Several related embodiments are presented, which extend the concept: In one related embodiment, a local oscillator (LO) signal is fed to multiple mixers or to multiple frequency multipliers gather than amplifiers). Another related embodiment compensates for transmission-line medium loss by attaching negative-resistance-producing circuits along the transmission-line medium. Single-ended and differential embodiments are presented.

In a similar manner, other embodiments of the invention provide aggregation of multiple signals. In these embodiments, signal sources are coupled to a transmission line medium at regular intervals via current sources having small output capacitance. The resulting artificial transmission line has a cut-off frequency which is designed to be above the operating frequency range. The signal can be picked from both sides of the transmission-line medium, or from just one side, with the other end terminated. The concept is illustrated in a non-limiting design of an aggregation network in an RFIC, where signals from several oscillators are aggregated at frequencies extending to 30 GHz.

The capability to attach a large number of tap elements to a single transmission-line medium is hampered by transmission-line medium losses. These losses arise from the resistivity of the transmission-line medium losses, in conjunction with the resistive component of tap element impedance. Several embodiments of the present invention are presented to counter this loss along the transmission line. One embodiment provides a tapered transmission-line medium with an increasing characteristic impedance, so that a larger voltage is built-up towards the end of the line. Second method is to use a mismatched load at eth end of the line, so that the voltage at the end of the line is increase. Third is connection of operational negative resistance tap elements along the transmission line. Fourth is production of negative resistance at the tap elements themselves through positive feedback. Actively countering the losses of the line may give rise to instability and parasitic oscillation. A method according to an embodiment of the invention is disclosed to control the loss compensation for avoiding instability.

Embodiments of the present invention provide compact and power-efficient arrangements for distributing signals to multiple modules, based on a transmission-line medium which is loaded at regular intervals by multiple connected predominantly-capacitive tap elements. In related embodiments, the tap elements include amplifiers, mixers, frequency multipliers, and so forth. An additional family of embodiments provides aggregation of multiple signals by attaching multiple current sources to a transmission-line medium, and collecting the desired signal at one or both ends of the medium. Additional embodiments provide methods to compensate for signal loss along the transmission-line medium as well as to compensate for the losses of the transmission-line medium itself. Disclosed methods are particularly suitable for RFICs supporting multiple transmit/receive (T/R) modules, such as in smart-antenna and multiple input—multiple output (MIMO) systems, and are suitable in an RFIC at frequencies exceeding 80 GHz.

Definitions

The term "transmission-line medium" herein denotes a linearly-extended physical medium for carrying electrical signals, including the transmission and/or distribution and/or aggregation of electrical signals, and having one or more external electrical connection locations for input and/or output of electrical signals. A non-limiting example of a transmission-line medium includes a pair of insulated electrical conductors which are substantially proximate over their linear extensions.

The term "tap" herein denotes an actual connection to the transmission-line medium at a specific location, wherein the connection is operative to pass electrical signals to and/or from the transmission-line medium; the term "tap element" herein denotes any device, component, or circuit connected to the transmission-line medium at a tap; and the term "operational tap element" denotes a tap element which facilitates the operation of a transmission-line medium, including but not limited to transmission, reception, distribution, input, and/or output of electrical signals carried by the transmission-line medium.

The term "tapped transmission line" herein denotes a transmission-line medium along with at least one operational tap element connected thereto. An operational tap element connected to the transmission-line medium of a tapped transmission line is considered to be a functional part of the tapped transmission line.

In certain non-limiting embodiments of the present invention as disclosed and illustrated herein, the electrical signals carried by a tapped transmission line are Radio Frequency (RF) signals.

BRIEF DESCRIPTION OF THE DRAWINGS

The subject matter disclosed may best be understood by reference to the following detailed description when read with the accompanying drawings in which:

FIG. 9a illustrates a differential transmission-line medium periodically loaded with differential transistor pairs serving as tap element amplifiers according to an embodiment of the invention.

FIG. 9b illustrates the case where a differential pair forms part of a polarity-controlled cascade circuit according to an embodiment of the invention.

FIG. 9c shows a related embodiment of the invention, where the polarity of the tapped signals can be chosen.

Figure 1:
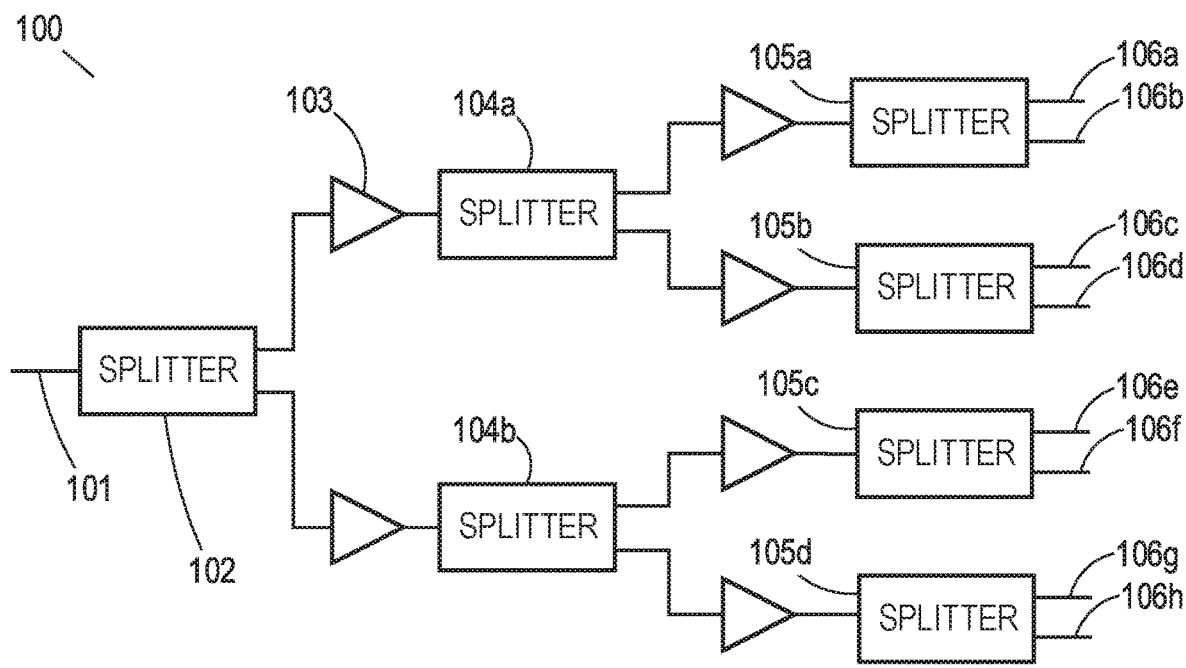
FIG. 1 illustrates a prior art scheme for signal distribution to multiple consumers, based on a splitting tree.

For simplicity and clarity of illustration, elements shown in the figures are not necessarily drawn to scale, and the dimensions of some elements may be exaggerated relative to other elements. In addition, reference numerals may be repeated among the figures to indicate corresponding or analogous elements.

DETAILED DESCRIPTION

Modern RF communications and radar systems use smart antennas (such as beamforming or MIMO antennas) having numerous antenna elements attached to numerous transceiver modules. In such systems there is a need to distribute an RF signal (or an auxiliary signal such as a local oscillator signal) to multiple modules. A common prior-art solution, illustrated in FIG. 1, places an input 101 into a cascade of splitters 102-104a/104b-105a/105b/105c/105d, typically with amplifiers (e.g., an amplifier 103), to produce multiple replicas of the desired signal at outputs 106a/106b/106c/106d/106e/106f/106g/106h. However, the use of such passive power splitters is space-consuming, as power splitters are commonly of a size commensurate with the wavelength of the signal. Moreover, each split into 2 introduces a 3 dB power loss (due to power conservation), thus requiring amplifiers (e.g., amplifier 103) to compensate for this loss—amplifiers which consume both power and space. The transmission-line media of tree distribution network 100 may become space-consuming and introduce routing difficulties.

Figure 2:
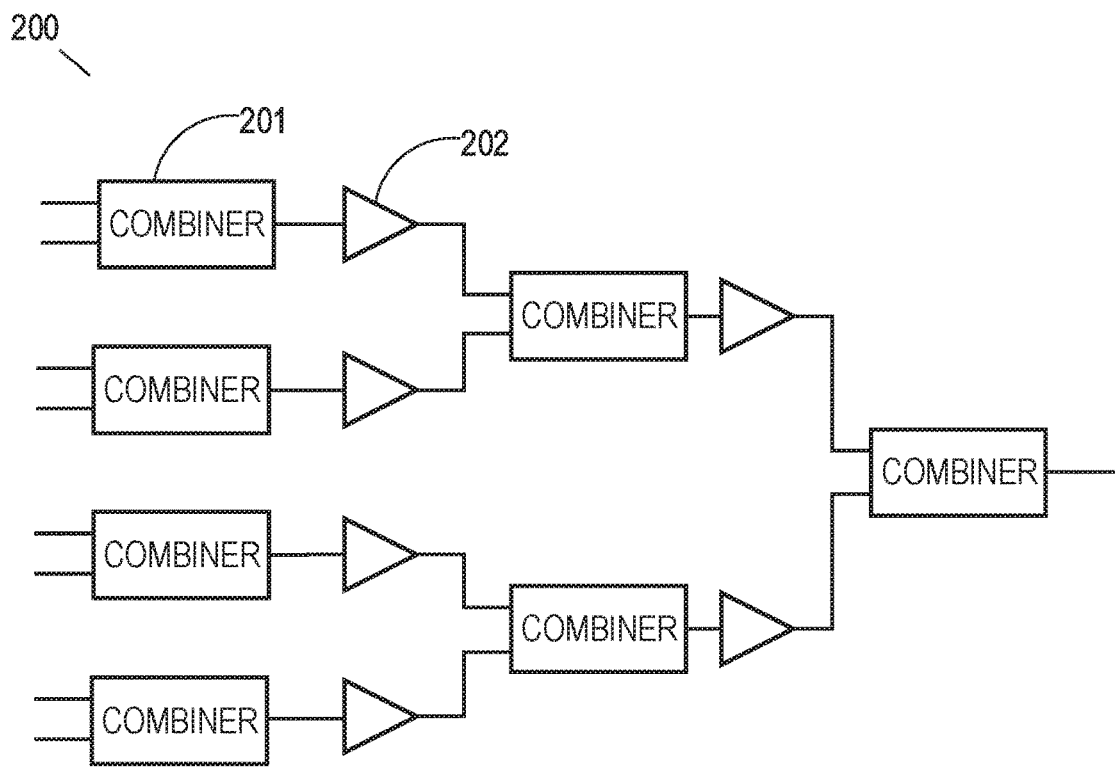
FIG. 2 illustrates a prior art scheme for signal aggregation from multiple sources, based on a combining tree.

Similar issues arise when signals need to be aggregated. FIG. 2 illustrates a commonly-encountered prior art tree of combiners 200, which requires numerous combiners (e.g., a combiner 201), amplifiers (e.g., an amplifier 202), connected by an intricate network of transmission-line media.

Figure 3:
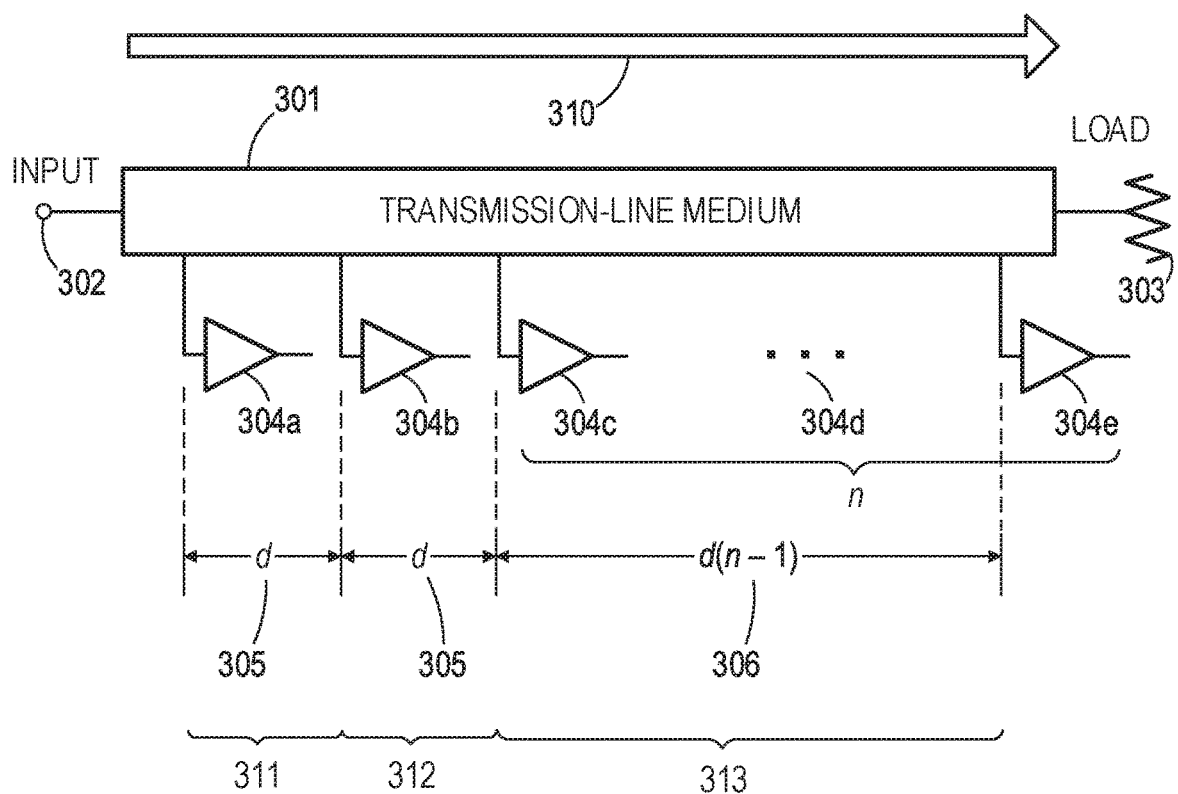
FIG. 3 illustrates signal distribution to multiple consumers by a voltage-sensing tapped transmission-line medium according to an embodiment of the invention.

FIG. 3 illustrates an embodiment of the present invention, in which a transmission-line medium 301 periodically loaded with operational tap elements is used to distribute and/or aggregate signals along a physical length 310 which is divisible into length intervals (such as an interval 311, an interval 312, and an interval 313). Transmission-line medium 301 has a signal input 302 at one end and a terminating load 303 at the other end, and is tapped with multiple operational tap elements, including initial operational tap elements 304a/304b/304c, intermediate operational tap elements indicated by an ellipsis 304d, and a final operational tap element 305e. In a related embodiment, operational tap elements 304a, 304b, 304c, 304d, and 304e are amplifiers or buffers. In another related embodiment, operational tap elements 304a, 304b, 304c, 304d, and 304e are substantially identical. In an additional related embodiment, operational tap elements 304a, 304b, 304c, 304d, and 304e are substantially identical, whatever their structure or function. In yet a further related embodiment, operational tap elements 304a, 304b, 304c, 304d, and 304e are distributed at substantially identical physical inter-tap distances along transmission-line medium 301. In the non-limiting example of this embodiment shown in FIG. 3, the physical inter-tap distance between tap element 304a and tap element 304b is a distance d 305. Likewise, the inter-tap distance between tap element 304b and tap element 304e is substantially the same distance d 305. The general case is illustrated for n tap elements 304c/304d/304e, where n≥2, and the physical inter-tap distance between tap element 304e and tap element 304e is substantially d(n−1) for any value of n, so that the physical inter-tap distance between any two adjacent taps is substantially the same distance d.

In the case of signal distribution (FIG. 3), a signal propagates along transmission-line medium 301, from source input 302, to first amplifier 304a, then to second amplifier 304b, and so on. Each amplifier causes minimal disturbance to the signal on transmission-line medium 301, allowing the signal to propagate substantially unchanged. In still another related embodiment, load 303 has a resistance equal to the characteristic impedance of transmission-line medium 301 to prevent signal reflection back toward input 302. Signal reflection may have undesired effects unless controlled or utilized as discussed below.

Figure 4:
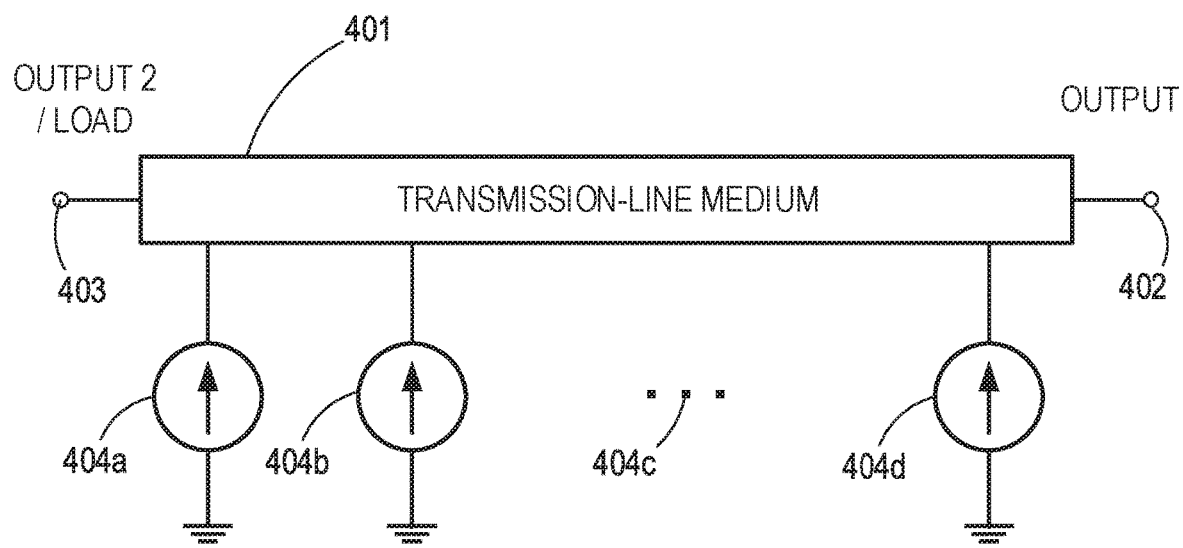
FIG. 4 illustrates signal aggregation from multiple sources by a current-injection tapped transmission-line medium according to an embodiment of the invention.

FIG. 4 illustrates signal aggregation via a transmission-line medium 401 according to an embodiment of the present invention. Tap elements 404a/404b/404d and additional tap elements indicated by an ellipsis 404c are each current sources that inject a signal into transmission-line medium 401. The injected signals combine and propagate in both directions along transmission-line medium 401. Tap elements 404a/404b/404c/404d present high shunt impedances to transmission-line medium 401, and therefore the contribution of any one tap element is not significantly attenuated by the other tap elements. The combined signal eventually appears at both ends of the line. At one end, a first output 402 feeds another circuit (not shown), and at the other end a second output 403 either feeds another circuit (not shown) or is terminated by a matched load (not shown).

Figure 5:
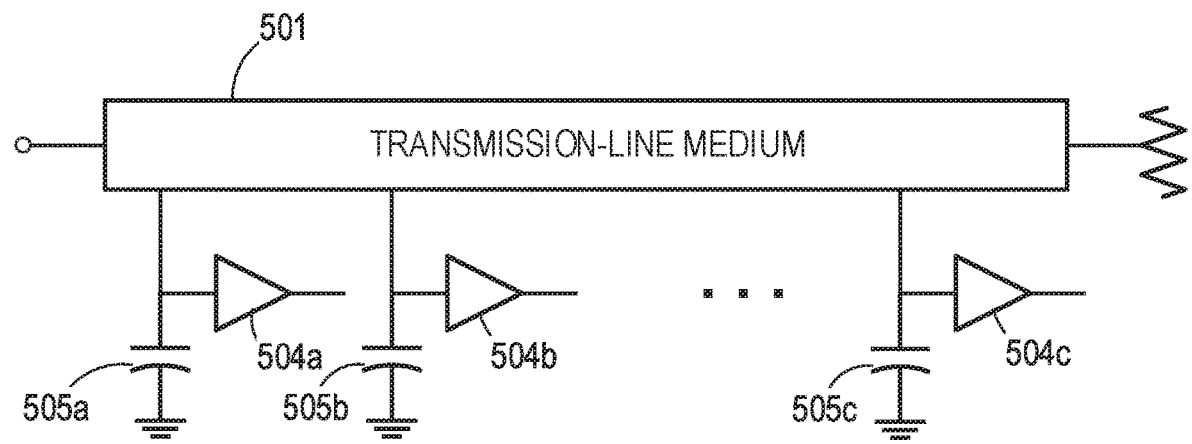
FIG. 5 is an illustration of signal distribution to multiple consumers, accounting for the input capacitance of the consumers according to an embodiment of the invention.
Figure 6:
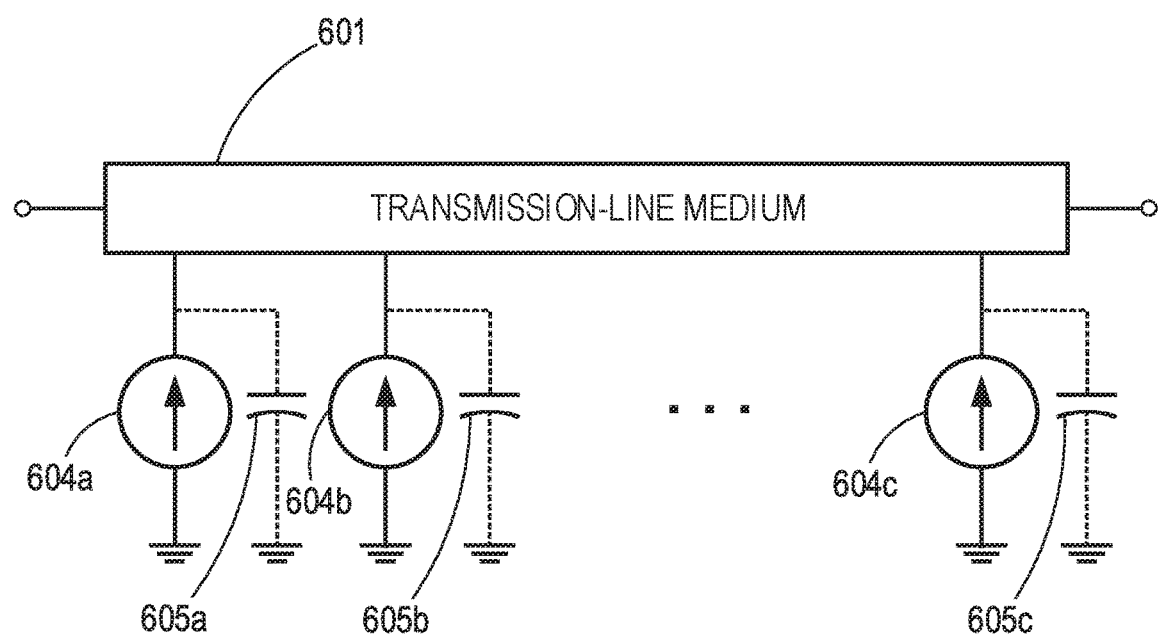
FIG. 6 illustrates signal aggregation from multiple sources, accounting for the output capacitance of current-injecting tap elements according to an embodiment of the invention.

FIG. 3 and FIG. 4 show simplified views of the system; in practice the impedance presented by a tap element amplifier or source is not negligible compared to the characteristic impedance of the line. FIG. 5 illustrates the case where amplifiers 504a/504b/504c have inputs exhibiting respective input capacitance 505a/505b/505c, even if the capacitance is just that of a field-effect transistor (FET) gate. Similarly, FIG. 6 illustrates the case where current sources 604a/604b/604c have outputs exhibiting respective output capacitance 605a/605b/605c, even if the capacitance is just that of a transistor drain.

Figure 7A:
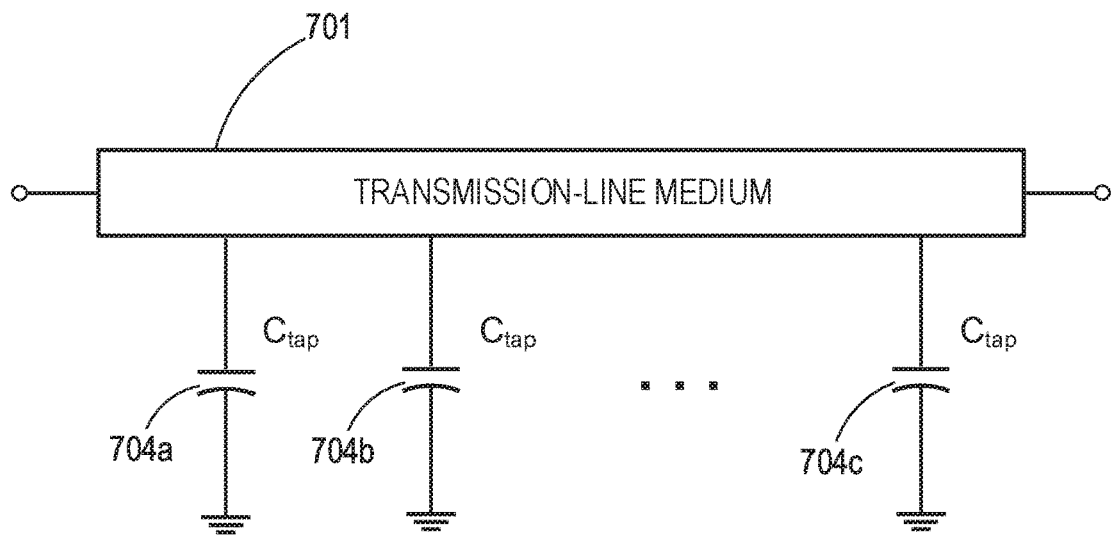
FIG. 7a illustrates sections of transmission-line medium, periodically loaded with tap element capacitances according to an embodiment of the invention.

FIG. 7a illustrates multiple distributed tap element capacitances 704a/704b/704c on a transmission-line medium 701, causing a cumulative effect. As the signal propagates along transmission-line medium 701 past each tap, the related capacitance causes cumulative disturbances.

Figure 7B:
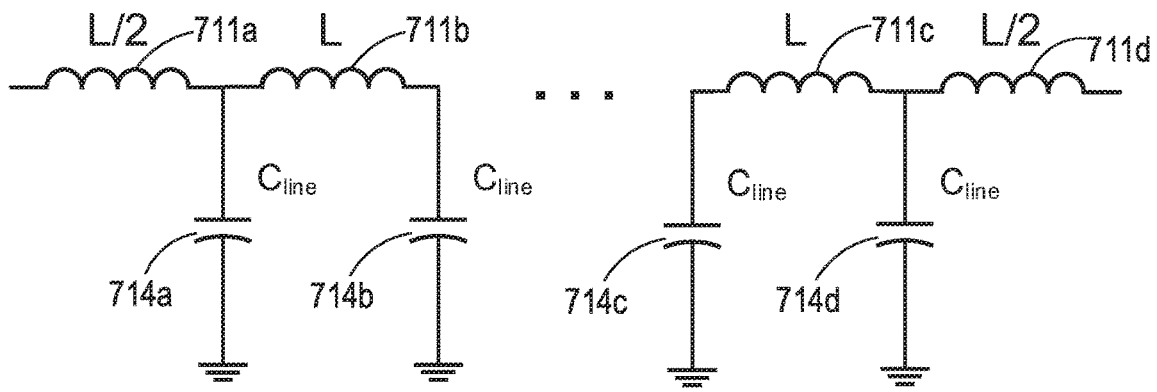
FIG. 7b illustrates transmission-line medium sections as approximated by L-C sections according to various embodiments of the invention.
Figure 7C:
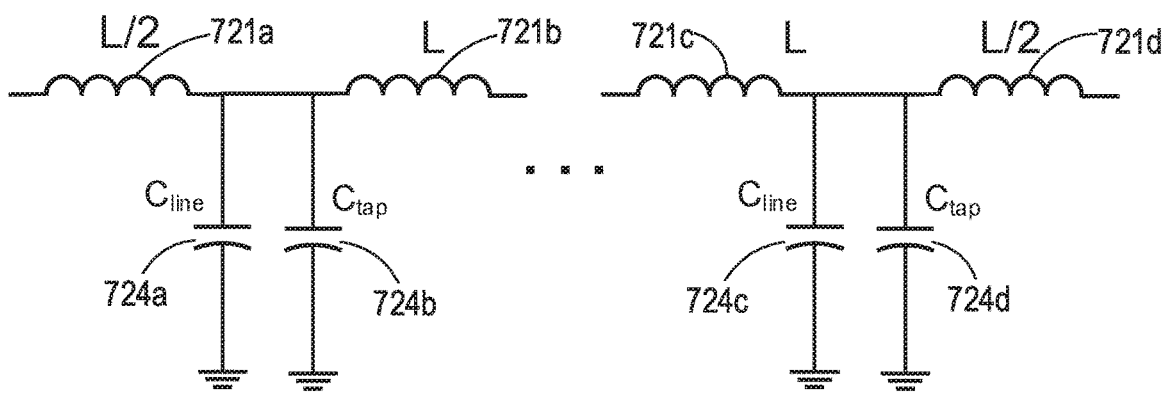
FIG. 7c illustrates L-C approximation of a transmission-line medium, as further loaded by tap element capacitances to increase the capacitive component according to an embodiment of the invention.

The effect of capacitive inclusions along the line is best understood by recalling that a continuous transmission-line medium can be approximated by a ladder network of series inductances and shunt inductances. FIG. 7b illustrates just such a ladder network, with series inductances 711a/711b/711c/711d and shunt capacitances 714a/714b/714c/714d. A network composed of identical two-ports exhibits at each frequency a characteristic impedance and a per-stage response, which can then be mathematically raised to a power to obtain the composite response. Lossless networks can exhibit passbands (at which the signal is passed along, possibly with a phase shift, but without appreciable reflection or attenuation) and stopbands (at which the signal is reflected and attenuated). The L-C network approximates a transmission-line medium with characteristic impedance $$Z_0 = \sqrt{\frac{L}{C}},$$

and having a delay per stage of $\tau = \sqrt{LC}$, up to a cutoff frequency $$F_{cut} = \frac{1}{2\pi\sqrt{LC}},$$

implying that a transmission-line medium, which is composed of infinitesimal L-C segments, has an infinite bandwidth. It also implies that the L-C ladder approximation holds so long as each section is shorter than ≈λ/6. If the line is loaded periodically with capacitances $C_{tap}$, and each line section is shorter than ≈λ/6, then the line can be approximated by a ladder network in which the inductances are $L_{line} = \tau Z_0$, and the capacitances are $C_{line} = \tau/Z_0$. The line loaded with the $C_{tap}$ capacitors can now be approximated by an equivalent L-C line, in which the composite capacitances have the value $C_{line} + C_{tap}$. The implications of this is that:

(1) the characteristic impedance is lowered according to $$Z_0' = Z_0 \sqrt{\frac{C_{line}}{C_{line} + C_{tap}}};$$

(2) the delay of each section is increased according to $$\tau' = \tau \sqrt{\frac{C_{line} + C_{tap}}{C_{line}}} \ ;$$

(3) the composite line now has a cutoff frequency of $$F'_c = \frac{1}{2\pi\tau'},$$

which gets lower as the tap element capacitance is increased. Therefore, the maximal value of tap element capacitance that can be absorbed into an equivalent transmission-line medium is closely related to the operating frequency.

A particular design example is a distribution network for millimeter wave RFIC including multiple T/R modules, spaced 200 microns from each other. With a effective dielectric constant of ~4, the delay of 200 micron line segment is 1.3 picoseconds, and it can be represented (for $Z_0$=50Ω) by an L-C approximation with L=0.066 nH and C=26 fF. The target operating frequency is ~80 GHz. For this operating frequency, approximating each 200 micron section with a single LC section is too coarse, but simulation confines that tap element capacitances up to ≈50 fF can be used, while having a cutoff frequency high enough (above 120 GHz).

Several embodiments of the invention are illustrated below. The examples below use differential transmission-line media, as the use of differential mode components is common in RFICs to reduce signal leakage and to reduce RF signal in ground and in supply lines. It should be further noted that the schematics of the amplifier circuits are shown in a basic form, omitting numerous details, such as tail-current sources, bias voltages, and drain loads.

Figure 8A:
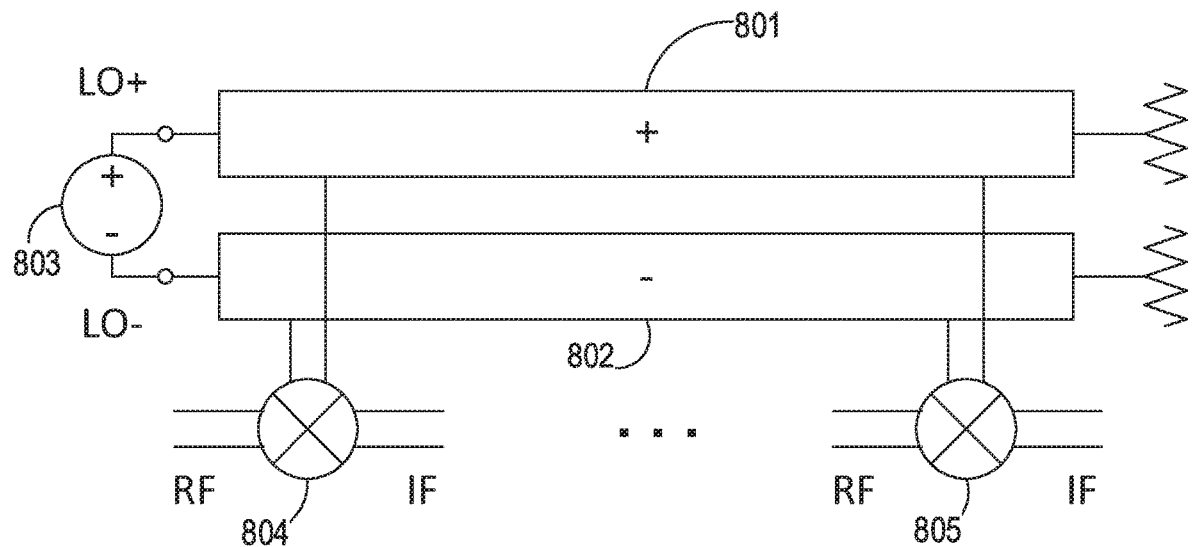
FIG. 8a illustrates a multi-port receiver having a local oscillator drive signal transmission-line medium distributed to multiple downconverting mixers, according to an embodiment of the invention.
Figure 8B:
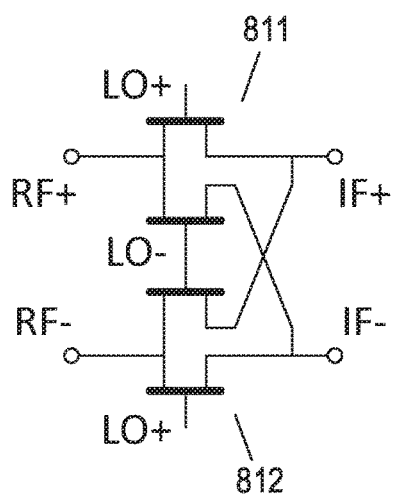
FIG. 8b illustrates an embodiment of passive switching down-converter mixer with gates of the switch transistors being driven by an LO signal distributed through the transmission-line medium according to an embodiment of the invention.
Figure 8C:
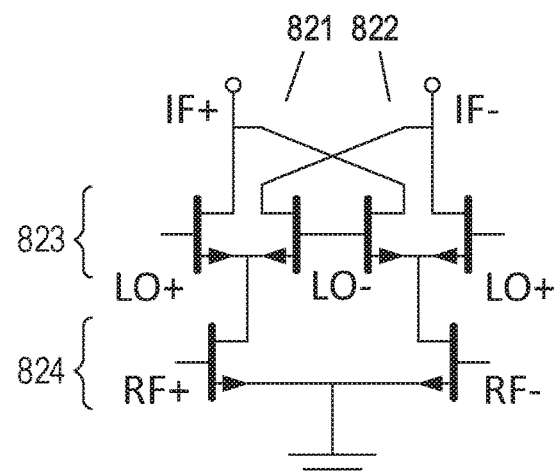
FIG. 8c illustrates a Gilbert-cell-based down-converter mixer according to an embodiment of the invention.

A first embodiment, illustrated in FIG. 8a, attaches local oscillator (LO) 803 inputs of multiple mixers 804 and 805 to transmission-line media 801 and 802, to efficiently implement a multichannel receiver. Several examples of mixers can be considered. FIG. 8b illustrates a "switching mixer" composed of two pairs 811 and 812 of FET switches, the gates of which are driven by the local oscillator. A second embodiment, illustrated in FIG. 8c, uses Gilbert cell multipliers 821 and 822 as mixers—in this case the local oscillator signal can be applied either to top transistors 823 or to bottom transistors 824, while the signal is applied to the other input to the mixers. This embodiment obviates the need to use a LO buffer amplifier in each receiver; only one buffer amplifier is needed at the input to the transmission-line medium to develop an adequate voltage swing at the LO port of the mixer.

A second embodiment, illustrated in FIG. 9a for a differential transmission-line medium 901/902 periodically loaded with differential transistor pairs (typically like a pair 903, with an ellipsis 904 indicating additional similar differential transistor pairs) serving as tap element amplifiers, such as for distributing a transmitted signal to multiple Tx/Rx modules. These tap element amplifiers can be all active at the same time, as in phased array radars, or one at a time, as in MIMO radars. The amplifier can be a single differential pair 903, as illustrated in FIG. 9a, or it can utilize a cascode amplifier 913, as shown in FIG. 9b, with the advantage of lower Miller capacitance being reflected to the inputs. The term "cascode" refers to a combination of a common-drain and common-gate stages (in the case of FETs), well known in the art. The cascade configuration can be further augmented as shown in FIG. 9c, to include two top transistors 923 (as in a Gilbert cell 922). Selecting one of the two top-transistors 923 allows controlling signal polarity (as in BPSK modulation). Applying bias to both pairs 923 and 924 allows both gain and polarity control.

Figure 10A:
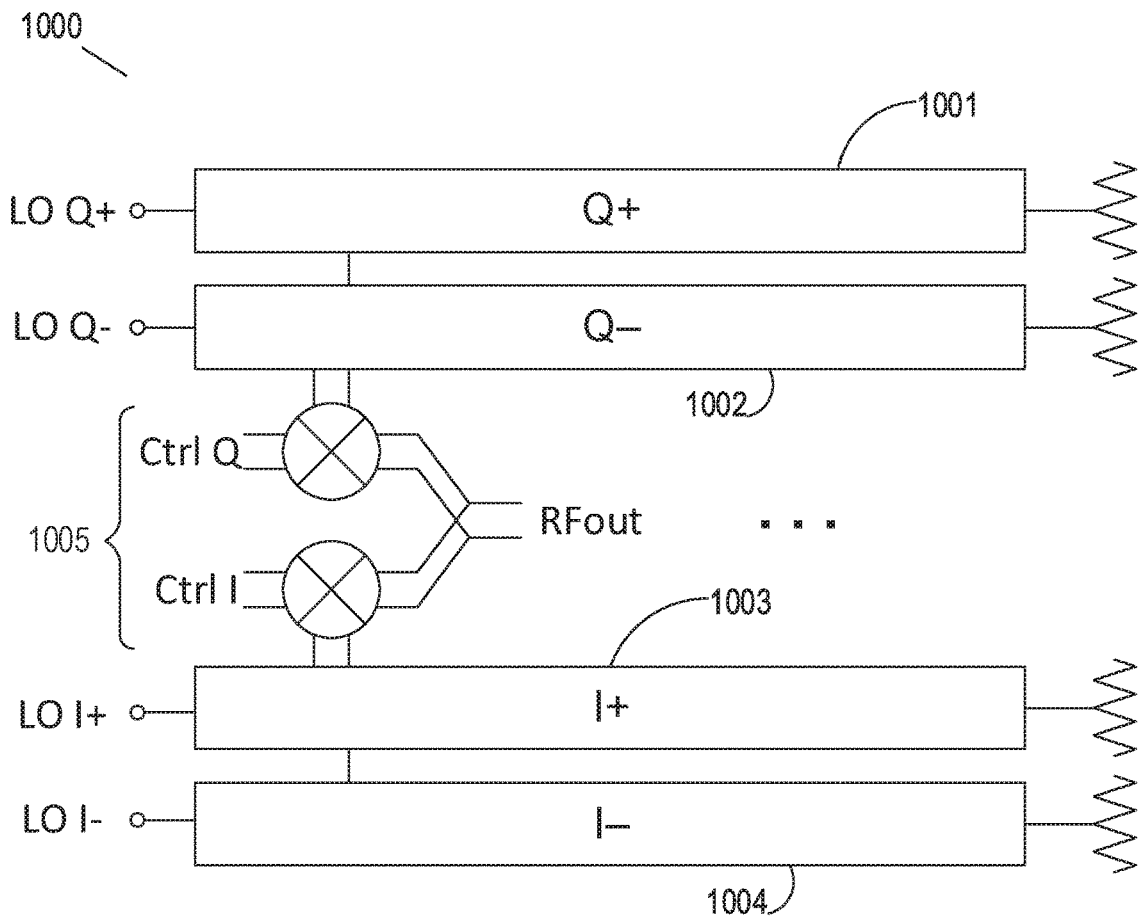
FIG. 10a illustrates a multi-port transmitter with embedded vector modulator tap elements within each tap module according to an embodiment of the invention. The 90-degree split of the LO is shared among all the units.
Figure 10B:
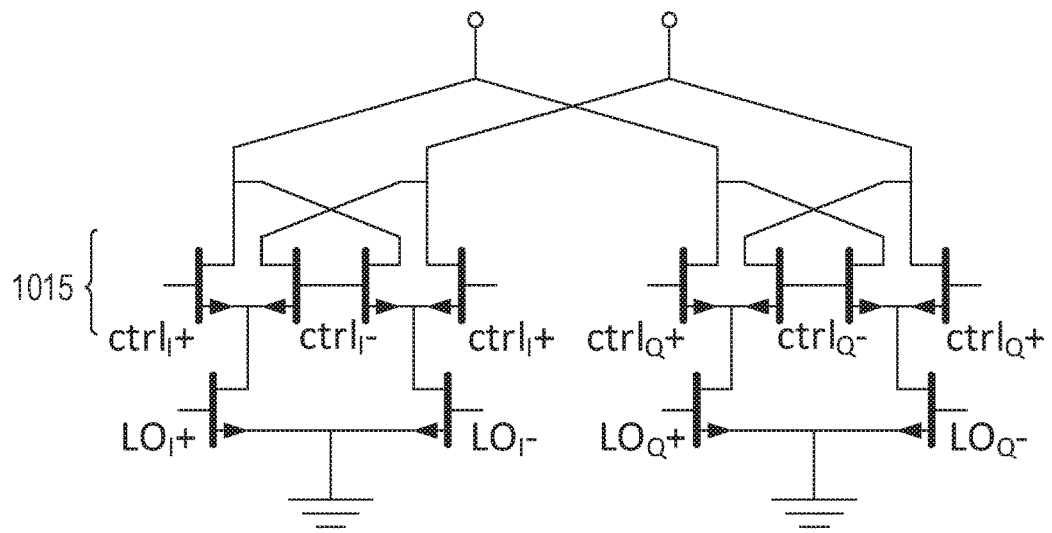
FIG. 10b illustrates a vector-modulated tap element amplifier according to an embodiment of the invention.

FIG. 10a illustrates an extension of the embodiments of FIGS. 8a-8c and 9a-9c to implement a phased array transmitter with phase control in each transmit module, such as a transmit module 1000. In this related embodiment two transmission-line media are used, one including a differential transmission-line medium 1003/1004 for carrying an in-phase replica of the transmitted signal, and a second, differential transmission-line medium 1001/1002 for carrying a quadrature replica of the transmitted signal. At module 1000, both lines 1001/1002 and 1003/1004 are tapped with a mixer 1005, e.g. Gilbert cell 922 in FIG. 9c. By combining the currents of multiplied signals at the drains of top transistors 1015, as illustrated in FIG. 10b, and applying cos φ and sin φ gains to the two mixers, a vector-modulated signal is obtained, with a phase shifted by φ. In this case, a substantial saving in complexity and cost is obtained by implementing the 0-90 degree split of the signal only once, at the input to the distribution lines, rather than on a per-module basis.

Figure 17:
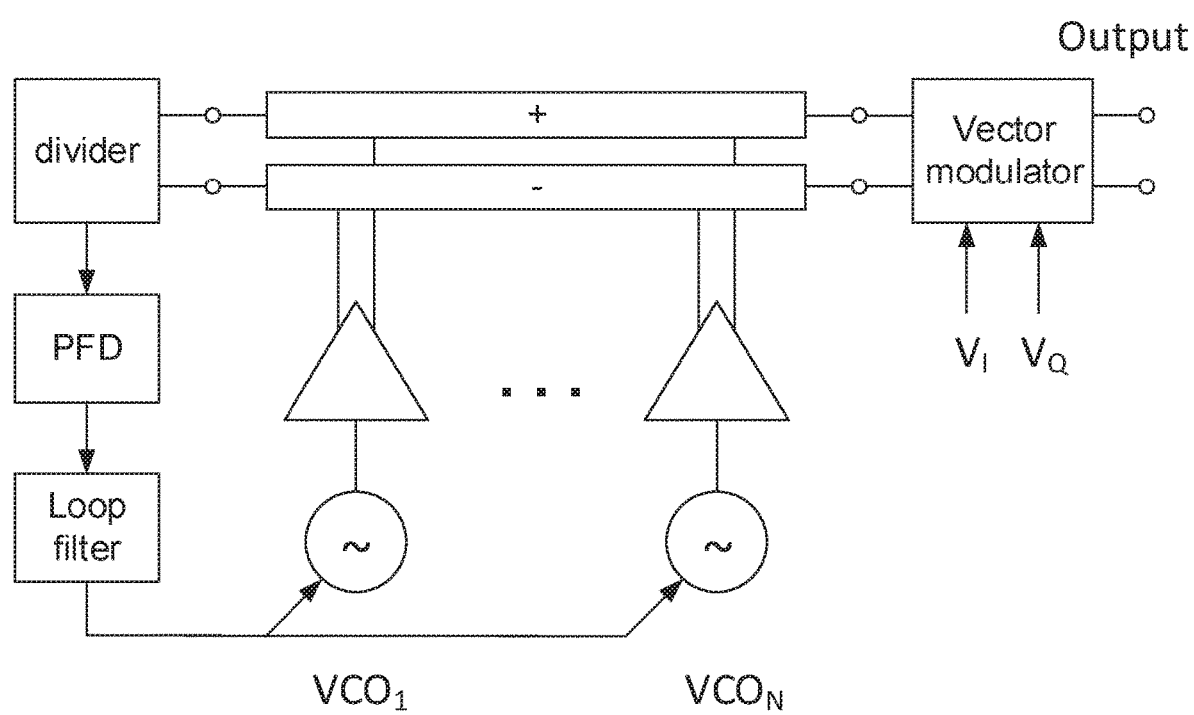
FIG. 17 illustrates a synthesizer with multiple voltage-controlled oscillators (VCOs) aggregated into a transmission-line medium using common synthesizer components (divider, phase detector, loop filter) and modulator, according to an embodiment of the invention.

A third exemplary embodiment is related to aggregation of multiple signal sources. An exemplary application in mind is creating a broadband frequency synthesizer, which requires (for phase noise optimization) multiple voltage controlled oscillators (VCOs), of which one is active at a time, as exemplified in FIG. 17. By attaching a voltage-to-current converter to each VCO (e.g. a differential transistor pair with output at the drain), and connecting the current outputs to a transmission-line medium, an aggregation network is obtained. As an example, both ends of the transmission can be utilized, one for the divider of the synthesizer, and one for a vector modulator to generate the desired signal.

It is worth noting that at the circuit level implementation commonly the tap elements require same DC voltage—for example $V_G$ when gates of transistors are connected to the transmission-line medium, or $V_{DD}$ the drains are connected. In these cases, the tap element circuits can be DC-coupled to the line; the supply of this voltage can be performed jointly through the transmission-line medium, and the voltage generation and stabilization circuitry (such as current mirrors, LDOs (low drop-off regulators) etc.) can be implemented only once rather than per-module.

Loss Compensation

In practical implementations of the above-described principle, the transmission-line media exhibit loss. This has the detrimental effect of the signal not being of same amplitude at all the taps. For example, transmitted signals can differ in amplitude, or the receive mixers can exhibit different conversion loss due to a differing LO drive.

Figure 11A:
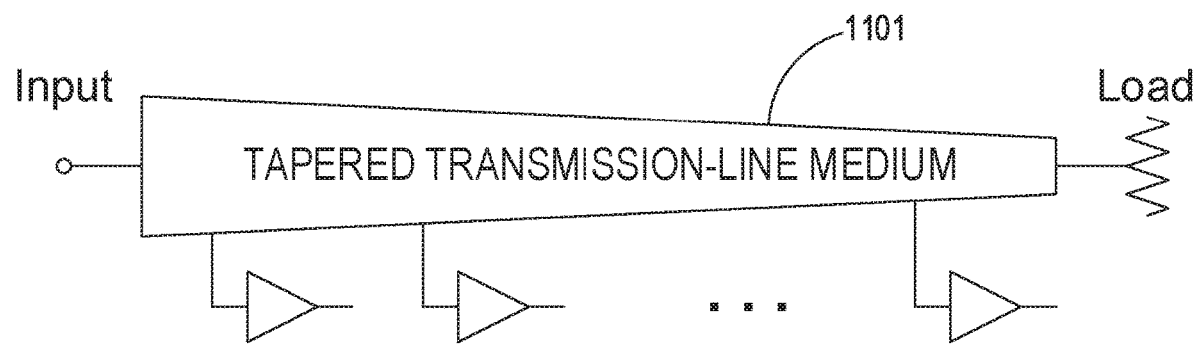
FIG. 11a illustrates compensation for the transmission-line medium loss by use of a tapered transmission-line medium according to an embodiment of the invention, wherein the increasing characteristic impedance of the line increases the voltage swing and compensates for transmission-line medium loss.
Figure 11B:
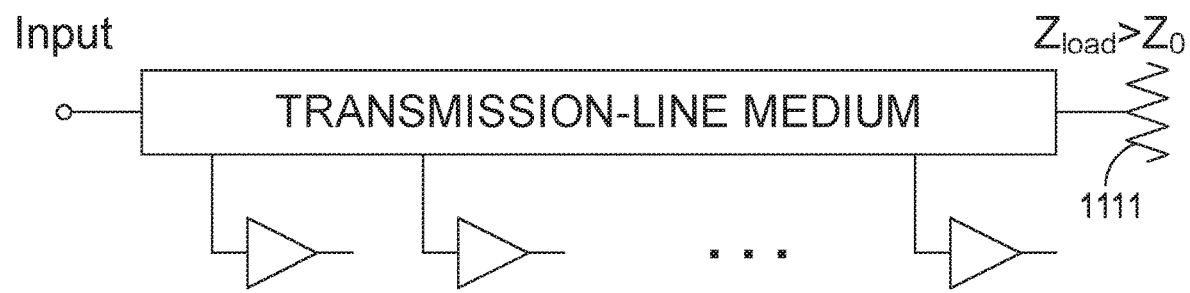
FIG. 11b illustrates compensation for transmission line medium loss by use of a reflective termination to enhance the voltage by using standing waves according to an embodiment of the invention.

FIG. 11 illustrates alternative techniques for compensating for transmission-line medium loss. Tapered transmission-line media are known to operate as transformers which convert lower voltage at lower impedance to a higher voltage at higher impedance. FIG. 11a illustrates compensation for the transmission-line medium loss by use of a tapered transmission-line medium 1101, wherein the increasing characteristic impedance of the line increases the voltage swing and compensates for transmission-line medium loss. FIG. 11b illustrates compensation for the transmission-line medium loss by use of a reflective termination 1111 to enhance the voltage through utilization of standing waves towards the end of the line.

Figure 12:
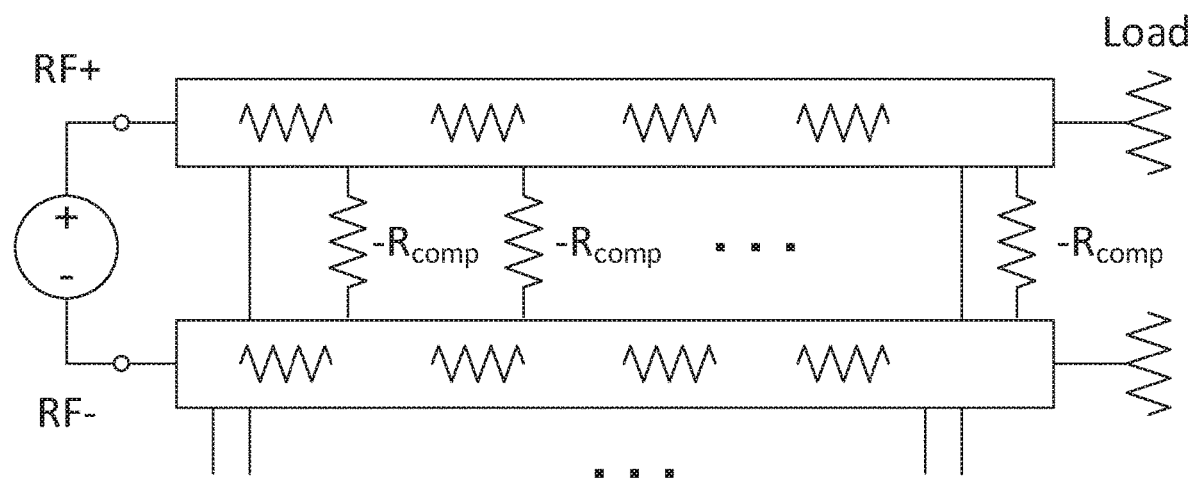
FIG. 12 conceptually illustrates negative resistance compensation for transmission-line medium loss according to an embodiment of the invention.

FIG. 12 conceptually illustrates compensating for transmission-line medium loss by attaching negative resistances along the transmission-line medium. Negative resistances according to various embodiments of the present invention are exhibited by negative resistance operational tap elements. The loss within a section of transmission-line medium is roughly modeled by a resistance to ground. In turn, a resistance to ground can be countered by a negative resistance of the same magnitude connected in parallel to the loss resistance. Therefore, according to an embodiment of the present invention, operational negative resistance tap elements, which exhibit negative resistance (or conductance) are connected to successive small sections of the transmission-line medium, so that the resulting structure behaves as a transmission-line medium of reduced loss per unit length. In related embodiments, the negative resistance is implemented by active circuits of the operational tap elements, which typically consume power in order to replenish the energy of the signal which is lost in the transmission-line medium. According to these embodiments, when the magnitude of negative resistance is high enough, the transmission line exhibits amplification, with the signal increasing as it propagates. Amplification is generally undesirable, as it detracts from the uniformity of signal level experienced by the tap elements. Another undesirable side-effect of amplification is oscillation.

Figure 13:
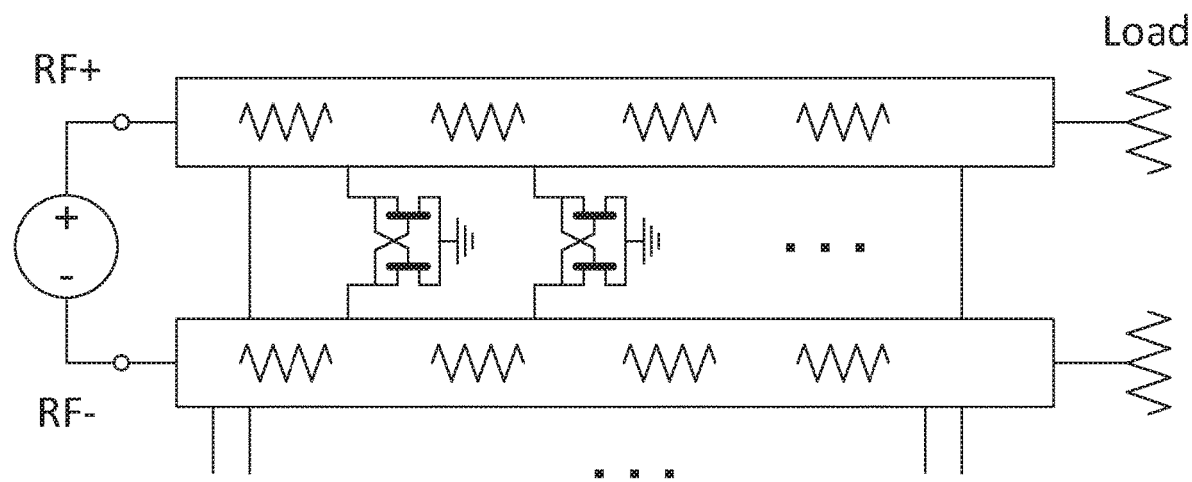
FIG. 13 illustrates negative resistance compensation for transmission-line medium loss by cross-coupled transistor pairs according to an embodiment of the invention.

FIG. 13 illustrates an embodiment of the invention that provides compensation for transmission-line medium loss by attaching cross-coupled transistor pairs along the transmission-line medium. The cross-coupled transistor pair is known to exhibit a negative differential transconductance—an effect commonly used in oscillators. Here it is used to compensate for the transmission-line medium loss. Preferably, the differential pair is augmented with frequency-selective circuitry so that the negative transconductance is predominant at higher frequencies, at which the transmission-line medium loss is high, and is lower at the lower frequencies. According to a related embodiment, in the case of constant-envelope signal along the transmission line, the cross-coupled pairs operate in a saturated, rather than linear, regime.

Figure 14:
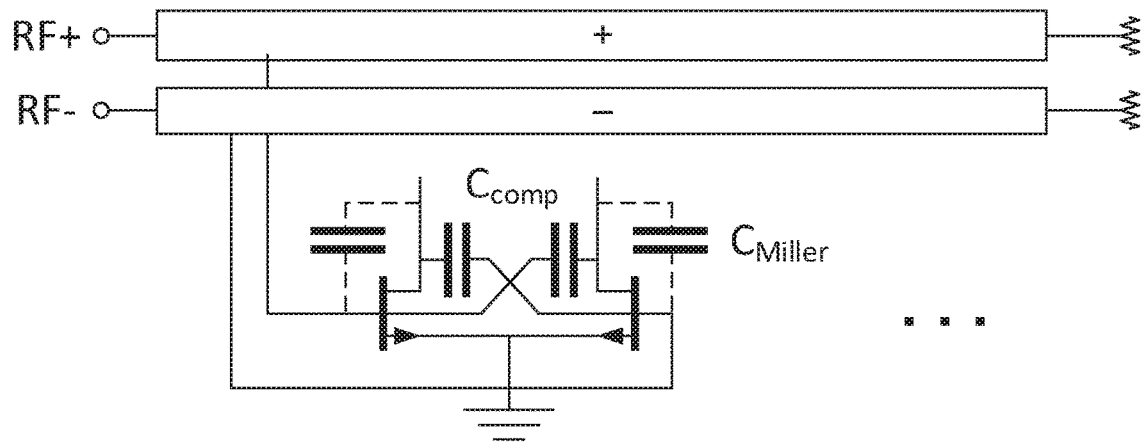
FIG. 14 illustrates multiport transmitter with neutralized tap element amplifiers to reduce effective input capacitance and introduce negative admittance compensation for transmission-line medium loss at the input of each tap element amplifier a positive feedback produced by neutralization capacitors, according to an embodiment of the invention.

FIG. 14 illustrates an alternative embodiment of compensating for transmission-line medium loss by producing negative resistance component at the input of each operational tap element amplifier using a positive feedback produced by neutralization capacitors. The neutralization capacitors counter the effect of Miller capacitance due to $C_{DG}$ capacitance of the transistors, thus decreasing the loading of the transmission-line medium. If the value of the neutralization capacitors exceeds $C_{DG}$, a positive feedback is created so that the input exhibits some negative resistance, which can be utilized to reduce the effective loss of the transmission-line medium.

In certain embodiments of the present invention, the negative resistances are provided by dedicated operational negative resistance tap elements. In other embodiments, however, negative resistances are provided by operational tap elements which may also provide other functionalities in addition to negative resistances.

Figure 15:
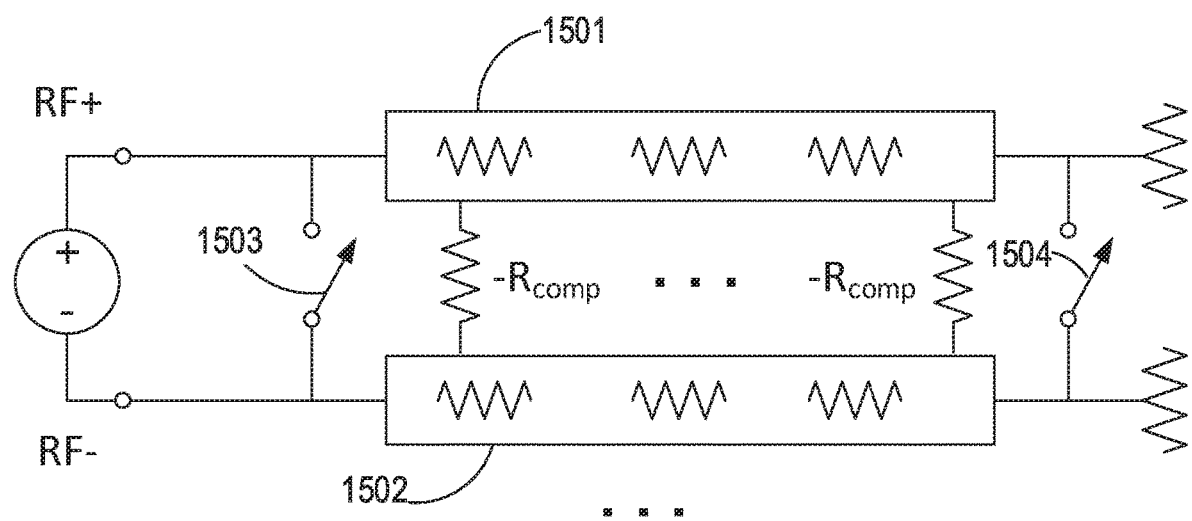
FIG. 15 illustrates a transmission-line medium loaded with negative resistances for adjustable loss compensation, having end-switches to test for stability, according to an embodiment of the invention.
Figure 16:
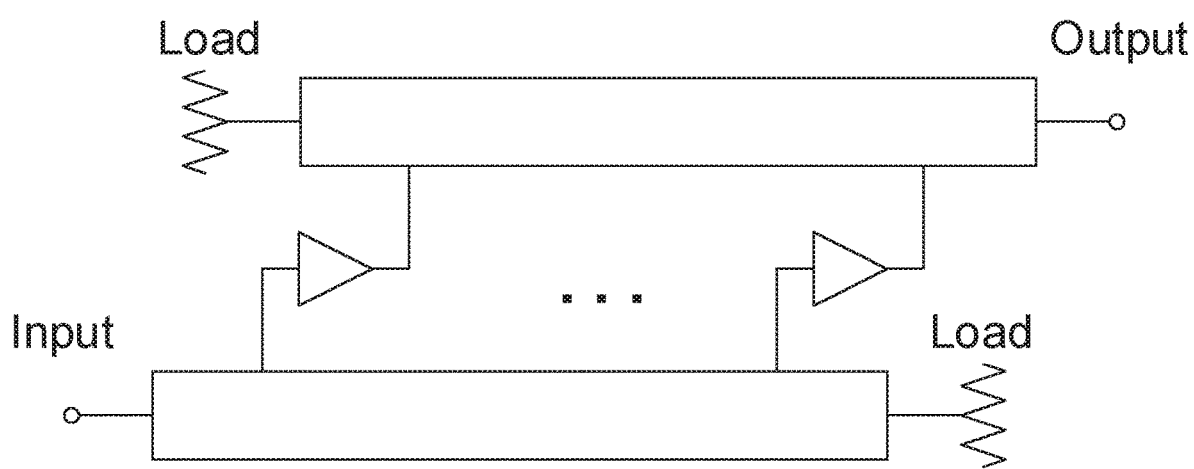
FIG. 16 illustrates a prior art distributed amplifier having tapped transmission-line media for combining amplified signals to achieve broadband amplification of a single signal.

Structures containing negative transconductance/resistance are prone to instability and oscillation. This tendency can be countered by controlling the value of the transconductance, to the extent that the losses are compensated but the stability is not compromised. As a non-limiting example, a common way to control the negative transconductance is by controlling the tail current of a cross-coupled differential pair. The value of the transconductance needs to be set to a value that compensates for the losses but avoids instability and oscillation. FIG. 15 illustrates an arrangement according to an embodiment of the present invention for testing a loss-compensated transmission-line medium 1501/1502 for stability so that the amount of compensation can be adjusted. The method is based on temporarily terminating the transmission-line media with reflective impedances (such as short-circuiting switches 1503 and 1504) and checking whether oscillation has occurred. Embodiments of the invention provide sensing of oscillation, for example, by a power detector that detects the presence of a signal with no input signal applied. Once the value of the transconductances is adjusted below the oscillation threshold, short-circuiting switches 1503 and 1504 are opened and the circuit is restored to the operational state, in which the effective loss of the transmission-line medium is significantly lower, and the signal along the line is more nearly uniform.

Applications

Embodiments of the present invention have numerous potential applications in multichannel RF systems, such as MIMO and phased array transmitters, receivers, transceivers, radars etc. The embodiments disclosed herein for signal distribution and aggregation are applicable to a variety of technologies, and in particular to integrated circuits (IC, ASIC, RFIC), where space savings and power consumption savings are paramount.

What is claimed is:

1. A tapped transmission line for distributing a first electrical signal to a plurality of modules, the tapped transmission line comprising
    a transmission-line medium for carrying the first electrical signal;
    a plurality of operational tap elements connected to the transmission-line medium at intervals along a physical length of the transmission-line medium; and
    a plurality of operational negative resistance elements connected at intervals along a physical length of the transmission-line medium;
    wherein:
        the operational tap elements exhibit predominantly capacitive impedance to the transmission-line medium;
        the operational negative resistance elements exhibit respective negative resistances; and
        each module of the plurality of modules is connected to a respective operational tap element of the plurality of operational tap elements; and
    wherein outputs of the plurality of modules are not connected to a common transmission-line medium.

2. The tapped transmission line of claim 1, wherein an operational tap element is selected from a group consisting of: an amplifier, a mixer, a frequency multiplier, and a vector modulator.

3. The tapped transmission line of claim 1, wherein the transmission-line medium is a differential transmission-line medium.

4. The tapped transmission line of claim 1, wherein the first signal is selected from a group consisting of: a transmitted signal, and a local oscillator signal.

5. The tapped transmission line of claim 1, wherein multiple transmission-line media distribute respective multiple electrical signals to the modules.

6. The tapped transmission line of claim 5, wherein there are two transmission-line media and a second electrical signal is a 90-degree shifted version of the first electrical signal.

7. The tapped transmission line of claim 1, wherein the respective negative resistances have controlled values, wherein the ends of the transmission-line medium can be short-circuited, and wherein the transmission line is testable for a presence of oscillations.

8. The tapped transmission line of claim 1 wherein the transmission-line medium is tapered.

9. The tapped transmission line of claim 1, wherein the first electrical signal is a radio frequency (RF) signal.

10. The tapped transmission line of claim 1, wherein an operational negative resistance element is a dedicated operational resistance element.

11. The tapped transmission line of claim 1, wherein an operational negative resistance element is an operational tap element.

12. A tapped transmission line for aggregating an electrical signal from a plurality of modules, the transmission line comprising:
    a transmission-line medium for carrying the electrical signal;
    a plurality of operational tap elements connected to the transmission-line medium at intervals along a physical length of the transmission-line medium; and
    a plurality of operational negative resistance elements connected at intervals along a physical length of the transmission-line medium;
    wherein
        the operational tap elements exhibit predominantly capacitive impedance to the transmission-line medium;
        the operational negative resistance elements exhibit respective negative resistances; and
        each module of the plurality of modules is connected to a respective operational tap element of the plurality of operational tap elements; and
    wherein inputs of the plurality of modules are not connected to a common transmission-line medium.

13. The tapped transmission line of claim 12 wherein exactly one module produces a signal current at a time.

14. The tapped transmission line of claim 12, wherein an end of the transmission-line medium has a signal sink, and another end of the transmission-line medium is terminated.

15. The tapped transmission line of claim 12, wherein two ends of the transmission-line medium have signal sinks.

16. The tapped transmission line of claim 12, wherein an operational negative resistance element is a dedicated operational resistance element.

17. The tapped transmission line of claim 12, wherein an operational negative resistance element is an operational tap element.

18. The tapped transmission line of claim 12, wherein the respective negative resistances have controlled values, wherein the ends of the transmission-line medium can be short-circuited, and wherein the transmission line is testable for a presence of oscillations.

19. The tapped transmission line of claim 12, wherein the electrical signal is a radio frequency (RF) signal.

\* \* \* \* \*